United States Patent
Wang et al.

(10) Patent No.: US 10,844,480 B2
(45) Date of Patent: Nov. 24, 2020

(54) METHOD FOR MAKING CARBON NANOTUBE FILM

(71) Applicants: Tsinghua University, Beijing (CN); HON HAI PRECISION INDUSTRY CO., LTD., New Taipei (TW)

(72) Inventors: Jiang-Tao Wang, Beijing (CN); Bing-Yu Xia, Beijing (CN); Peng Liu, Beijing (CN); Yang Wei, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 70 days.

(21) Appl. No.: 15/598,211

(22) Filed: May 17, 2017

(65) Prior Publication Data
US 2017/0335448 A1 Nov. 23, 2017

(30) Foreign Application Priority Data
May 20, 2016 (CN) .......................... 2016 1 0342262

(51) Int. Cl.
*C23C 16/26* (2006.01)
*C23C 16/52* (2006.01)
(Continued)

(52) U.S. Cl.
CPC .............. *C23C 16/26* (2013.01); *C01B 32/16* (2017.08); *C23C 16/4418* (2013.01);
(Continued)

(58) Field of Classification Search
CPC ..................................................... B01J 19/087
See application file for complete search history.

(56) References Cited

U.S. PATENT DOCUMENTS

| 10,011,488 B2 | 7/2018 | Jiang et al. |
| 2002/0123230 A1* | 9/2002 | Hubacek ............ C23C 16/45565 438/712 |

(Continued)

FOREIGN PATENT DOCUMENTS

| CN | 101279372 | 10/2008 |
| CN | 101352669 | 1/2009 |

(Continued)

OTHER PUBLICATIONS

Bower (Appl. Phys. Lett. 77, 830 (2000)) (Year: 2000).*

(Continued)

*Primary Examiner* — Joel G Horning
(74) *Attorney, Agent, or Firm* — ScienBiziP, P.C.

(57) ABSTRACT

A method for making carbon nanotube film includes providing a growth substrate having a first surface and a second surface opposite to the first surface. A catalyst layer is placed on the first surface. The growth substrate and the catalyst layer are placed in a reaction chamber. The carbon source gas and hydrogen are supplied into the reaction chamber at a growth temperature of a plurality of carbon nanotubes. An electric field is applied to the growth substrate, wherein an electric field direction of the electric field is from the first surface to the second surface. After the plurality of carbon nanotubes fly away from the growth substrate, the electric field is stopped applying to the growth substrate, and the carbon source gas and hydrogen are continually supplied into the reaction chamber.

18 Claims, 8 Drawing Sheets

(51) Int. Cl.
    *C01B 32/16*     (2017.01)
    *C23C 16/44*     (2006.01)
    *C23C 16/46*     (2006.01)
    *B82Y 30/00*     (2011.01)
    *B82Y 40/00*     (2011.01)

(52) U.S. Cl.
    CPC .............. *C23C 16/46* (2013.01); *C23C 16/52* (2013.01); *B82Y 30/00* (2013.01); *B82Y 40/00* (2013.01); *Y10S 977/742* (2013.01); *Y10S 977/843* (2013.01)

(56) References Cited

U.S. PATENT DOCUMENTS

| | | |
|---|---|---|
| 2007/0059370 A1 | 3/2007 | Chou et al. |
| 2007/0281086 A1* | 12/2007 | Hsiao .................. C23C 16/26 427/249.1 |
| 2015/0211980 A1 | 7/2015 | Wang et al. |
| 2016/0023903 A1 | 1/2016 | Jiang et al. |
| 2016/0023908 A1 | 1/2016 | Jiang et al. |

FOREIGN PATENT DOCUMENTS

| | | |
|---|---|---|
| CN | 102329527 | 1/2012 |
| CN | 102936010 | 2/2013 |
| CN | 104692357 | 6/2015 |
| CN | 104808325 | 7/2015 |
| CN | 105439114 | 3/2016 |
| TW | 200711722 | 4/2007 |
| TW | 1372188 | 9/2012 |
| TW | 1386511 | 2/2013 |
| TW | 201604129 | 2/2016 |
| TW | 201604130 | 2/2016 |

OTHER PUBLICATIONS

Wang (Nano Letters vol. 9, No. 9 pp. 3137-3141 (2009)) (Year: 2009).*

Kocabas (J. Am. Chem. Soc. 128, 4540-4541 (2006)) (Year: 2006).*

Ke Chang et al., Imaging of Ferroelectric Domains by Charged Nano particle Decoration Method, Journal of Synthetic Crystals, Oct. 31, 2006, 958-962, vol. 35, No. 5.

* cited by examiner

METHOD FOR MAKING CARBON NANOTUBE FILM

CROSS-REFERENCE TO RELATED APPLICATIONS

This application claims all benefits accruing under 35 U.S.C. § 119 from China Patent Application No. 201610342262.5, filed on May 20, 2016, in the China Intellectual Property Office, the disclosure of which is incorporated herein by reference.

FIELD

The present application relates to a method for making carbon nanotube film.

BACKGROUND

Carbon nanotubes are tubules of carbon generally having a length of 5 to 100 micrometers and a diameter of 0.5 to 100 nanometers. Carbon nanotubes can be composed of a number of coaxial cylinders of graphite sheets, and have recently attracted a great deal of attention for use in different applications such as field emitters, gas storage and separation, chemical sensors, and high strength composites. Recently, carbon nanotube films have been fabricated. A carbon nanotube film includes a plurality of carbon nanotube bundles that are joined end to end by van der Waals attractive force. Each of the carbon nanotube bundles includes a plurality of carbon nanotubes substantially parallel to each other. The plurality of carbon nanotube bundles joined end to end by van der Waals attractive force from the continuous carbon nanotube film. After being treated with organic solvent, the carbon nanotube film can be readily used in cables, printed circuit boards, cloths, and other macroscopic applications.

For mass production, the carbon nanotube film should be relatively long. However, the length of the carbon nanotube film is limited by an area of a super-aligned carbon nanotube array from which the carbon nanotube film is derived. In general, a diagonal length of a rectangular super-aligned carbon nanotube array is only about 4 inches. Thus, the length of the carbon nanotube film is correspondingly limited.

What is needed, therefore, is to provide a method for making carbon nanotube film that can overcome the above-described shortcomings.

BRIEF DESCRIPTION OF THE DRAWINGS

Implementations of the present technology will now be described, by way of example only, with reference to the attached figures, wherein.

DETAILED DESCRIPTION

Figure 1:
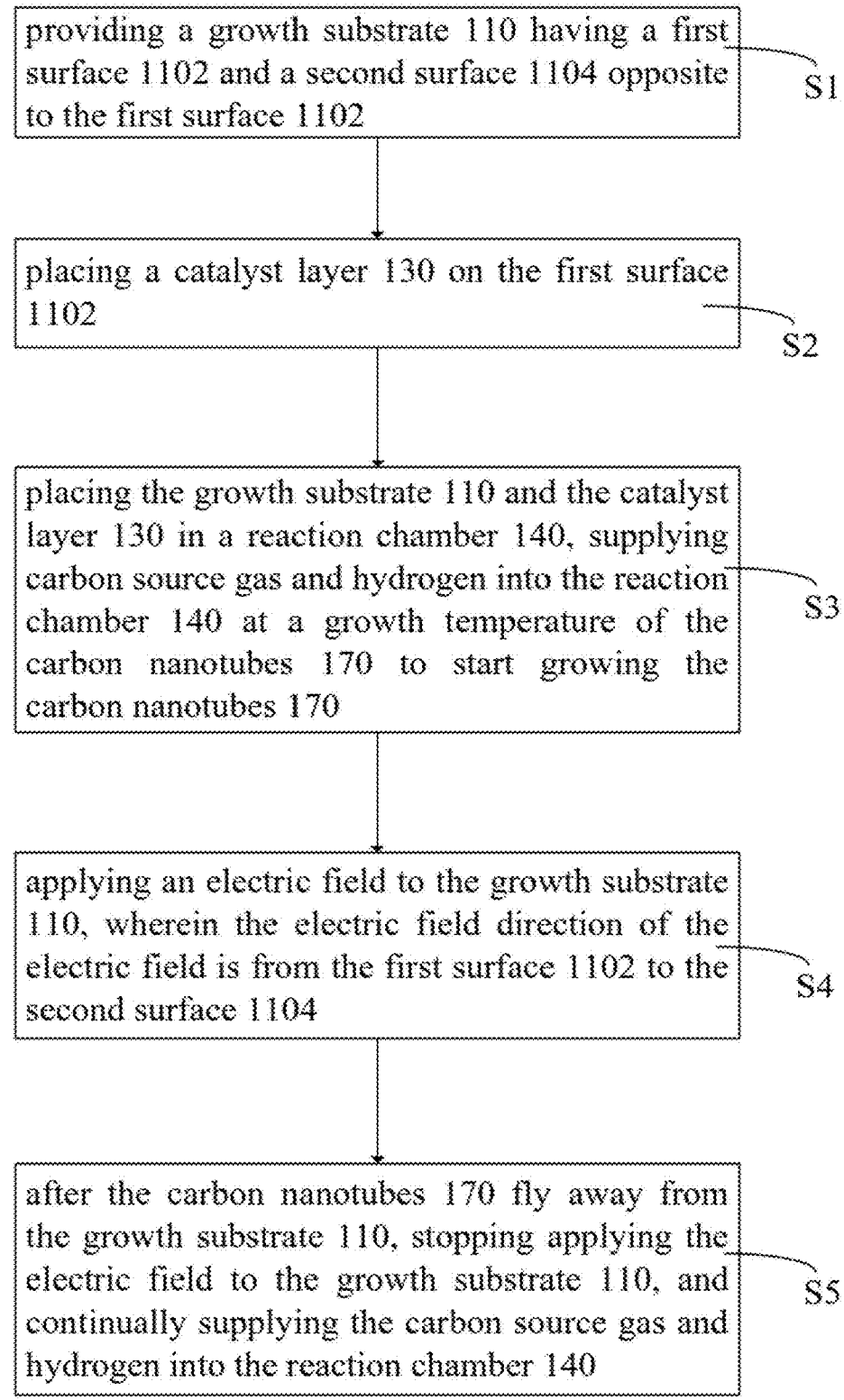
FIG. 1 is a schematic process flow of one embodiment of a method for making a carbon nanotube film.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated to illustrate details and features better. The description is not to be considered as limiting the scope of the embodiments described herein.

Several definitions that apply throughout this disclosure will now be presented.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 2:
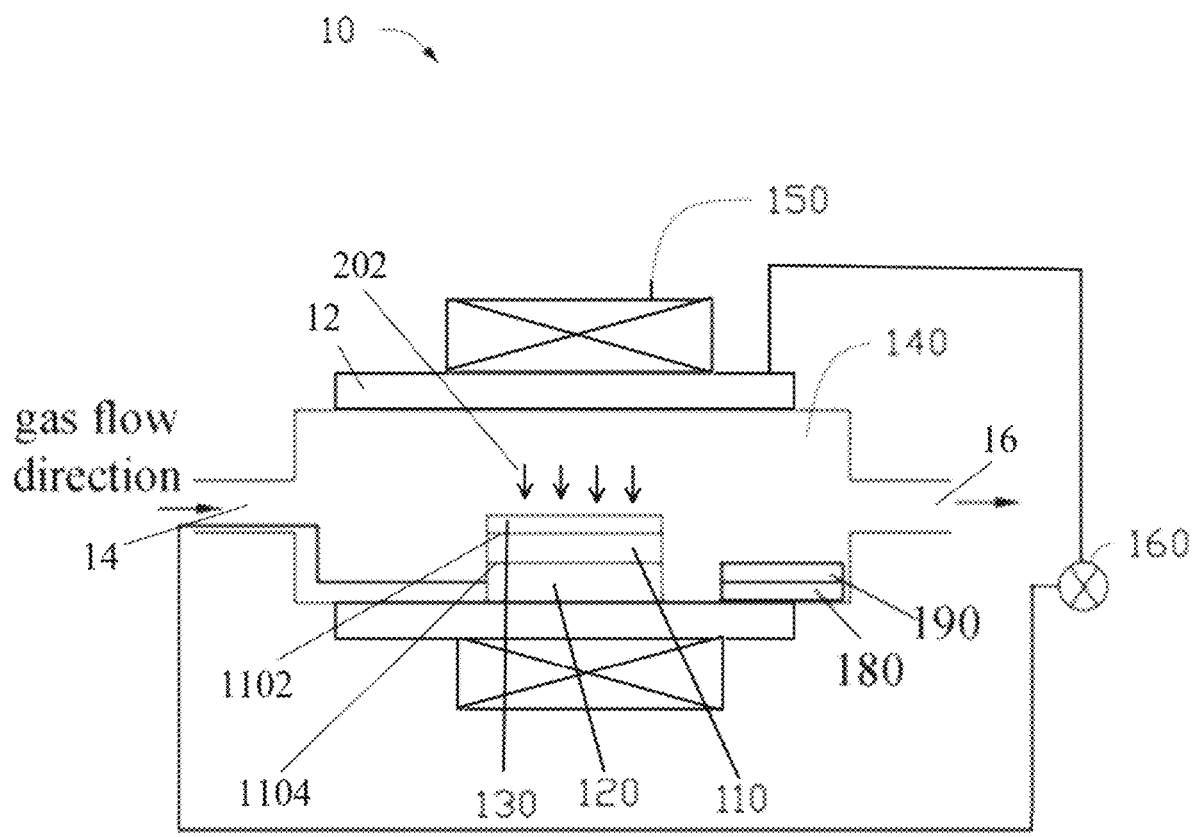
FIG. 2 is a schematic view of one embodiment of a device used for making the carbon nanotube film.
Figure 3:
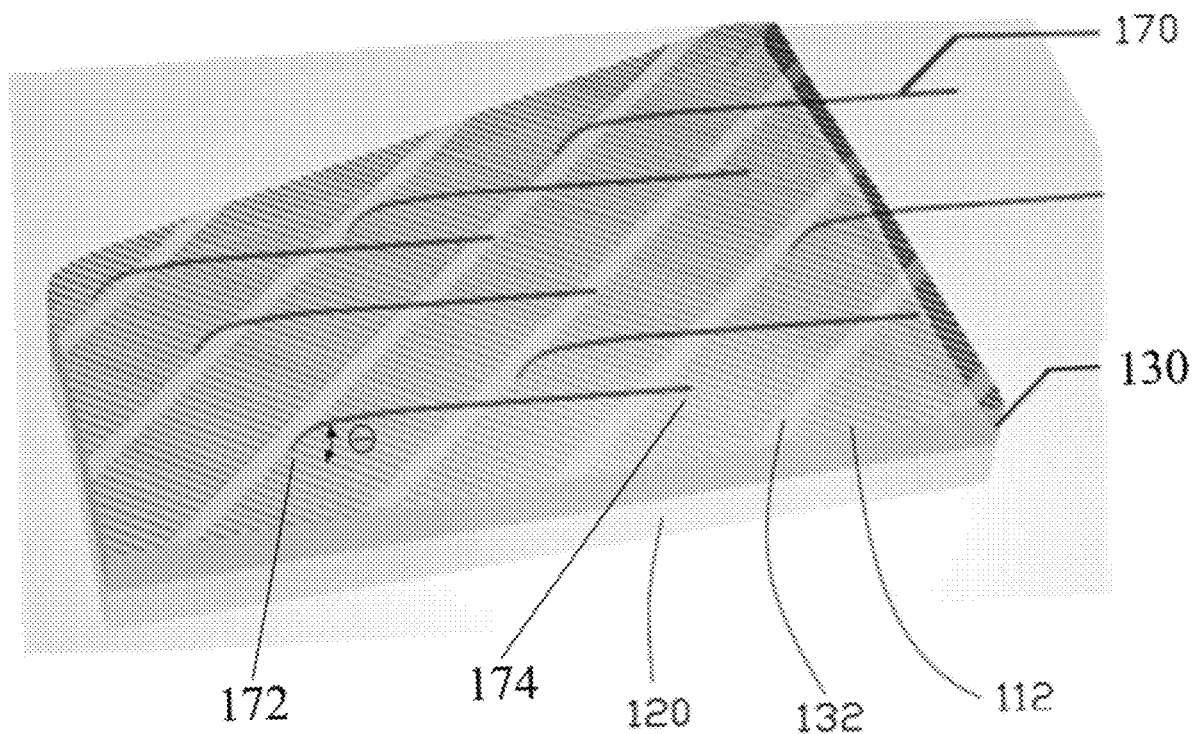
FIG. 3 is a schematic view of growth carbon nanotubes after applying a negative voltage to a growth substrate.

Referring to FIGS. 1-3, a carbon nanotube film 190 can be prepared in a device 10. A method for making the carbon nanotube film 190 of one embodiment includes steps of:

S1, providing a growth substrate 110 having a first surface 1102 and a second surface 1104 opposite to the first surface 1102;

S2, placing a catalyst layer 130 on the first surface 1102;

S3, placing the growth substrate 110 and the catalyst layer 130 in a reaction chamber 140, supplying carbon source gas and hydrogen into the reaction chamber 140 at a growth temperature of the carbon nanotubes 170 to start growing the carbon nanotubes 170;

S4, applying an electric field 202 to the growth substrate 110, wherein the electric field direction of the electric field 202 is from the first surface 1102 to the second surface 1104;

S5, after the second end 174 of each carbon nanotube 170 is detached from the growth substrate 110 and flies away from the growth substrate 110, stopping applying the electric field 202 to the growth substrate 110, and continually supplying the carbon source gas and hydrogen into the reaction chamber 140.

In the step S1, the growth substrate 110 is insulated at the growth temperature of the carbon nanotubes 170. In an embodiment, the growth substrate 110 is insulated at a temperature from about 900 degrees Celsius to about 1100 degrees Celsius. The growth substrate 110 can be a single crystal quartz. The growth substrate 110 has many crystal faces. The growth substrate 110 can be treated by stable temperature cut (ST-cut). After treating by ST-cut, the crystal face of the growth substrate 110 is exposed, and the exposed crystal face has a secondary symmetry. The exposed crystal face has many oriented lattices 112. When the electric field 202 is not applied to the growth substrate 110, the carbon nanotubes 170 can be guided by guiding force of the lattices 112 and grow along the extending direction of the lattices 112. The area and the thickness of the growth substrate 110 are not limited and can be selected according to need. In addition, the growth substrate 110 can be annealed for a time from about 7 hours to about 9 hours in an oxygen atmosphere at a temperature from about 700 degrees Celsius to about 1000 degrees Celsius, so as to repair the surface defects of the growth substrate 110.

Furthermore, the growth substrate 110 is located on a top surface of a base 120. The base 120 can be used to apply the electric field 202 to the growth substrate 110, and the electric field direction is from the first surface 1102 to the second surface 1104. Therefore, the base 120 needs to be conductive at the growth temperature of the carbon nanotubes 170. The material of the base 120 can be a conductive material at a high temperature, such as monocrystalline silicon. The area and the thickness of the base 120 are not limited and can be selected according to need.

In the step S2, the catalyst layer 130 is uniformly formed on the first surface 1102 of the growth substrate 110. The material of the catalyst layer 130 can be one of iron (Fe), cobalt (Co), nickel (Ni), or any combination thereof. The method for forming the catalyst layer 130 is not limited, such as lithography, sputtering, deposition, vapor deposition. In one embodiment, the material of the catalyst layer 130 is an iron layer, and the thickness of the catalyst layer 130 is about 0.2 nanometers. The catalyst layer 130 can be patterned so that the catalyst layer 130 has many strip structures 132. The strip structures 132 are parallel to each other and spaced from each other. The extending directions of the strip structures 132 are perpendicular to the extending directions of the lattices 112 of the growth substrate 110, as shown in FIG. 3. The patterning of the catalyst layer 130 can facilitate to observe the growth of the carbon nanotubes 170 and facilitate to obtain the takeoff rate of the carbon nanotubes 170. The method for patterning the catalyst layer 130 is not limited. In one embodiment, the catalyst layer 130 is patterned by a photolithography technique.

In the step S3, the reaction chamber 140 can be made of silicon dioxide. The reaction chamber 140 has an inlet 14 and an outlet 16 opposite to the inlet 14. In one embodiment, the reaction chamber 140 is a quartz tube. The growth substrate 110 and the catalyst layer 130 are placed in the reaction chamber 140, and the reaction chamber 140 is cleaned by a protective gas. The protective gas can be argon, and the volume flow of argon is about 400 sccm. The term "sccm" is the standard volt per minute and is the unit of volume flow. A heater 150 is located on the outside of the reaction chamber 140, and the heater 150 makes the temperature of the reaction chamber 140 reach the growth temperature of the carbon nanotubes 170. The growth temperature of the carbon nanotubes 170 can be in a range from about a temperature from about 900 degrees Celsius to about 1100 degrees Celsius. In one embodiment, the temperature of the reaction chamber 140 reaches about 970 degrees Celsius. And accordingly, the carbon source gas and hydrogen are supplied into the reaction chamber 140. In one embodiment, a mixture gas of $C_2H_4$ and $H_2$ is supplied into the reaction chamber 140, the volume flow of $C_2H_4$ is in a range from about 1.0 sccm to about 1.5 sccm, and the volume flow of $H_2$ is about 200 sccm.

In the step S4, the electric field direction of the electric field 202 is from the first surface 1102 to the second surface 1104, the electric field direction and the first surface 1102 can form an angle, and the angle can be greater than 0 degrees, and less than or equal to 90 degrees. In one embodiment, the electric field direction of the electric field 202 is vertical to the second surface 1104. Applying the electric field 202 to the growth substrate 110 and supplying the carbon gas and hydrogen to the reaction chamber 140 can be carried out simultaneously. Alternatively, the carbon gas and hydrogen can be supplied to the reaction chamber 140 after applying the electric field 202 to the growth substrate 110. The carbon gas and hydrogen cannot be supplied to the reaction chamber 140 before applying the electric field 202 to the growth substrate 110, because the carbon nanotubes 170 grow rapidly, the post-applied electric field 202 does not affect the growth of the carbon nanotubes 170. A negative voltage forming the electric field 202 can be in a range from about −1000 volt (V) to about 0 V. In one embodiment, the negative voltage is in a range from about −500 V to about 0 V. The time of applying the electric field 202 to the growth substrate 110 can be in a range from about 1 second to about 10 seconds. If the time of applying the electric field 202 to the growth substrate 110 is less than 1 second, the second end 174 of each carbon nanotube 170 cannot be detached from the growth substrate 110 and cannot fly away from the growth substrate 110. If the time of applying the electric field 202 to the growth substrate 110 is greater than 10 seconds, the carbon nanotubes 170 will stop growing because of disturbance of the electric field 202. In one embodiment, the carbon source gas and hydrogen gas are supplied into the reaction chamber 140, and the electric field 202 is simultaneously applied to the growth substrate 110, and the time of applying the electric field 202 is in a range from about 1 second to about 10 seconds.

The method for forming the electric field 202 is not limited and can be selected according to need. The present application discloses two embodiments of methods for forming the electric field 202.

One embodiment of method:

The reaction chamber 140 is surrounded by a metal shell 12. A power supply 160 is placed outside of the reaction chamber 140. The power supply 160 has a first terminal and a second terminal. The first terminal of the power supply 160 is electrically connected to the base 120 by a conductive wire, and the second terminal of the power supply 160 is electrically connected to the metal shell 12 by the conductive wire. The negative voltage is applied between the base 120 and the metal shell 12, to form the electric field 202. Because the growth substrate 110 is located between the base 120 and the metal shell 12, the growth substrate 110 is also in the electric field 202. The metal shell 12 supports and protects the reaction chamber 140. The metal shell 12 also shields the reaction chamber 140 from outside interference. The material of the metal shell 12 can be nickel, a resistive alloy or the like.

The material of the conductive wire is capable of withstanding the growth environment of the carbon nanotubes 170 and does not introduce impurities to contaminate the growth environment of the carbon nanotubes 170 in the reaction chamber 140. Thus, the material of the conductive wire is preferably carbon material. The conductive wire can be a carbon nanotube wire structure. The carbon nanotube wire structure includes a plurality of carbon nanotube wires substantially parallel with each other. The carbon nanotube wire structure can also include a plurality of carbon nanotube wires twisted with each other.

The carbon nanotube wire can be twisted or untwisted. The twisted carbon nanotube wire includes a plurality of carbon nanotubes helically oriented around an axial direction of the twisted carbon nanotube wire. The untwisted carbon nanotube wire includes a plurality of carbon nanotubes substantially extending along a same direction (i.e., a direction along the length of the untwisted carbon nanotube wire), and the carbon nanotubes are substantially parallel to the axis of the untwisted carbon nanotube wire. More specifically, the untwisted carbon nanotube wire includes a plurality of successive carbon nanotubes joined end to end by van der Waals attractive force therebetween.

A length of the carbon nanotube wire can be set as desired. In one embodiment, the length of the carbon nanotube wire can be in a range from about 10 micrometers to about 100 micrometers. A diameter of the carbon nanotube wire can be in a range from about 0.5 nanometers to about 100 micrometers. The carbon nanotubes in the carbon nanotube wire can be single-walled, double-walled, or multi-walled carbon nanotubes.

Figure 8:
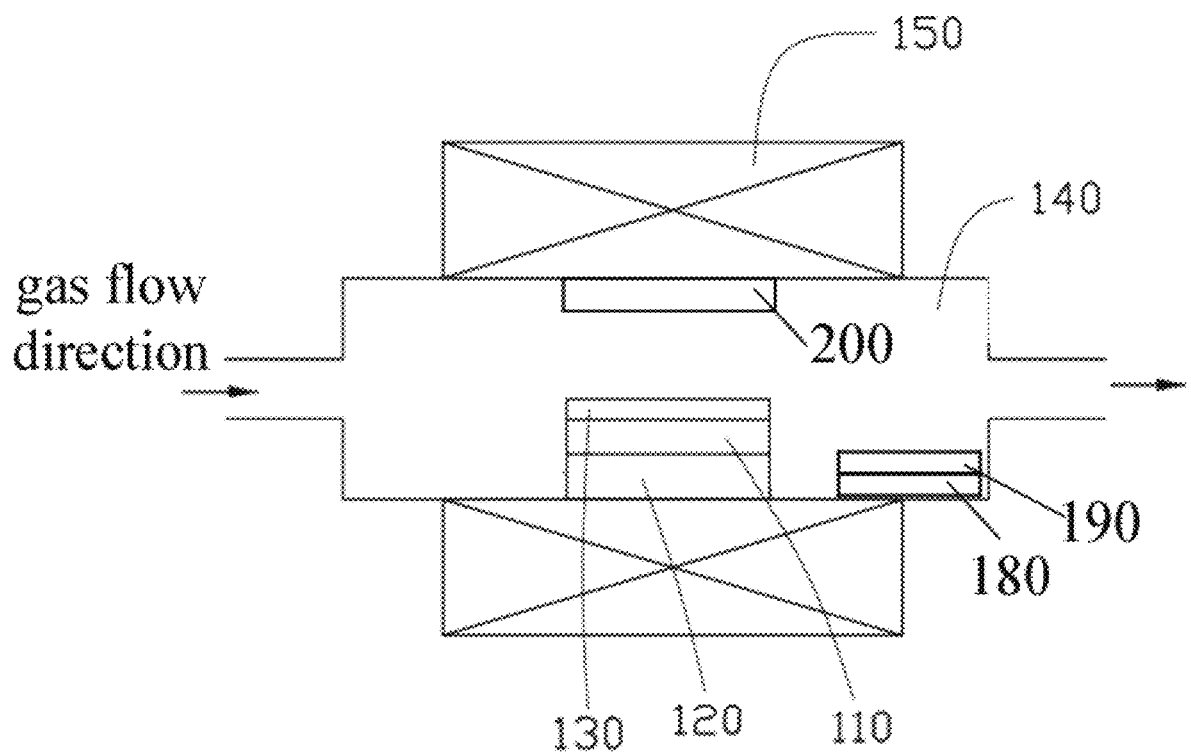
FIG. 8 is a schematic view of one embodiment for supplying an electric field.

Another embodiment of method:

As shown in FIG. 8, a conductive plate 200 is located inside of the reaction chamber 140 and fixed on the upper wall of the reaction chamber 140. The method for fixing the conductive plate 200 is not limited, for example, the conductive plate 200 is fixed on the upper wall of the reaction chamber 140 by an adhesive. The melting point of the adhesive is greater than the growth temperature of the carbon nanotubes 170. The conductive plate 200 is opposite to and spaced from the first surface 1102 of the growth substrate 110. A distance between the conductive plate 200 and the growth substrate 110 can be in a range from about 4 centimeters to about 5 centimeters. The electric field 202 is formed between the conductive plate 200 and the growth substrate 110, and the electric field direction is from the conductive plate 200 to the base 120. In order not to contaminate the growth environment of the carbon nanotubes in the reaction chamber 140, the material of the conductive plate 200 can be conductive carbon material, such as graphite or silicon. In one embodiment, the conductive plate 200 is a silicon wafer.

First, in the step S3, the carbon nanotubes 170 start to horizontally grow from the catalyst layer 130. The extending direction of the carbon nanotubes 170 is parallel to the first surface 1102 of the growth substrate 110. The carbon nanotubes 170 are attached to the first surface 1102 to grow along the extending directions of the lattices 112. Then, in the step S4, the electric field 202 is applied to the growth substrate 110. Accordingly, the carbon nanotubes 170 attached to the first surface 1102 are located in the electric field 202. The carbon nanotubes 170 have negative charges, and the electric field direction is from the first surface 1102 to the second surface 1104. Each carbon nanotube 170 has a first end 172 and a second end 174 opposite to the first end 172, and the first end 172 is in contact with the base 120. According to the Gauss's law "like charges repel but opposite charges attract", the rest parts of each negatively charged carbon nanotube 170 no longer adhere to the first surface 1102 of the growth substrate 110 and no longer grow along the extending direction of the lattices 112. the rest parts of each carbon nanotube 170 will deviate from the first surface 1102 of the growth substrate 110 and extend along a direction away from the growth substrate 110, and the carbon nanotubes 170 and the first surface 1102 are not in the same plane. Therefore, the extending direction of the carbon nanotubes 170 near the first end 172 and the first surface 1102 form an angle θ, as shown in FIG. 3. The angle θ is greater than 0 degrees and less than or equal to 90 degrees. In one embodiment, the angle θ is greater than 10 degrees and less than or equal to 90 degrees. In one embodiment, the angle θ is greater than 30 degrees and less than or equal to 60 degrees.

Figure 4:
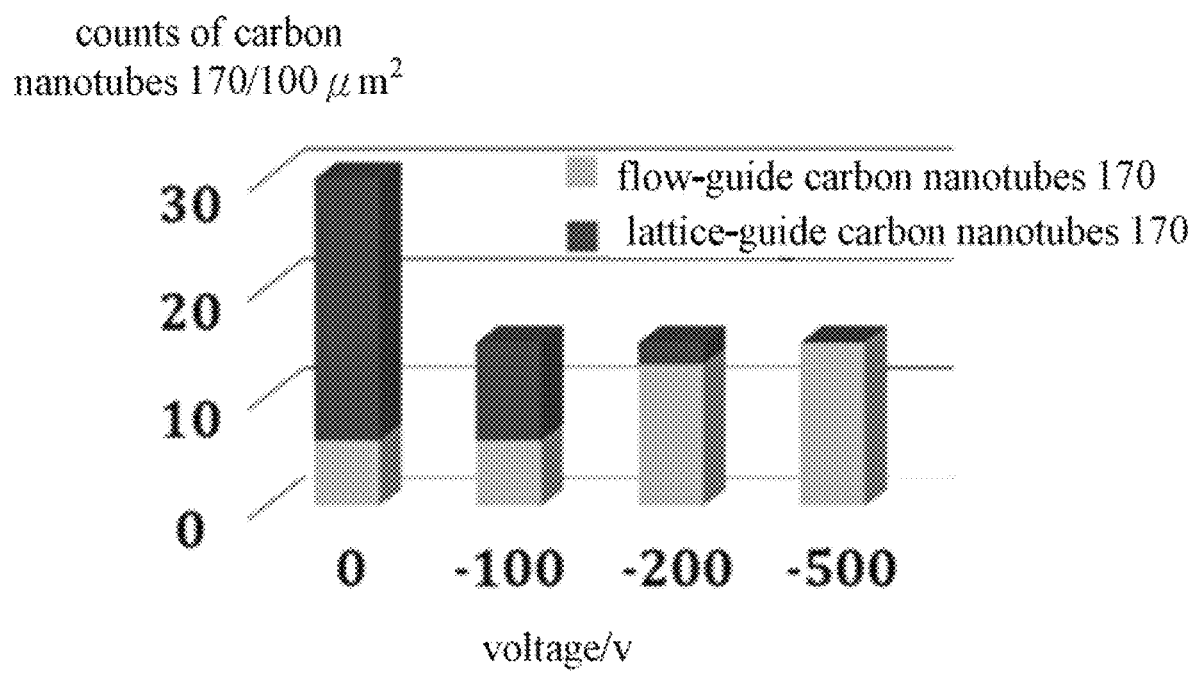
FIG. 4 shows the ratio between the flow-guided carbon nanotubes and the lattice-guided carbon nanotubes in different voltages.
Figure 5:
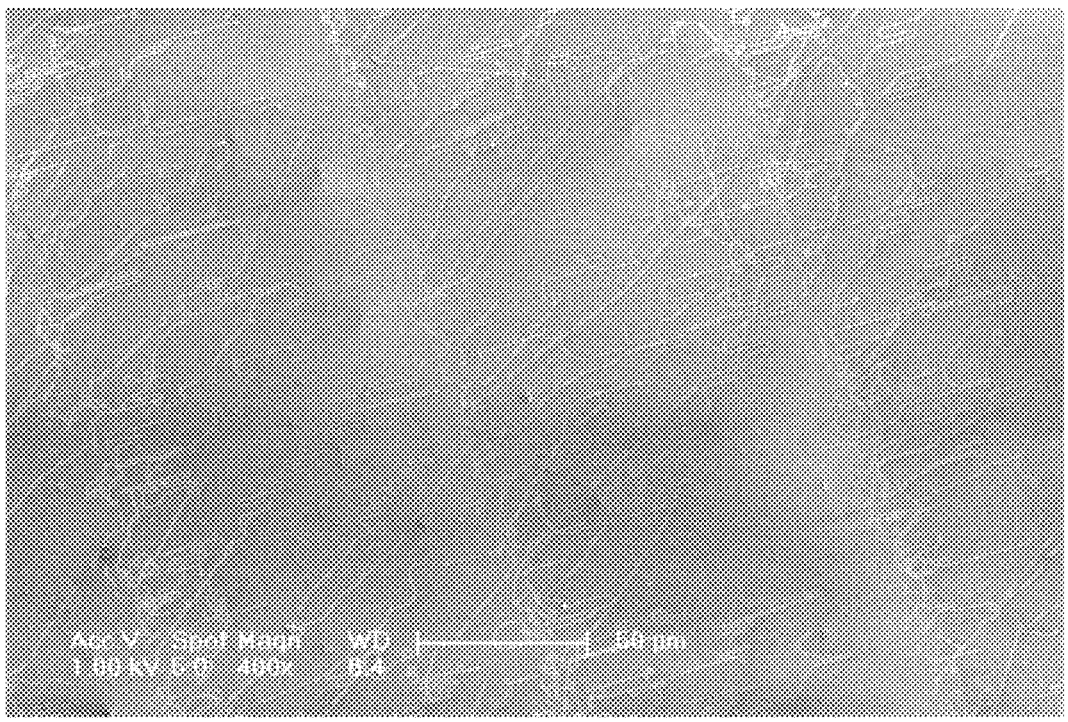
FIG. 5 is a scanning electron microscope (SEM) image of the carbon nanotube film when a voltage of −500 V is applied to the growth substrate.

Takeoff rate of the carbon nanotubes 170 is the ratio of a number of part of the carbon nanotubes 170 that deviate from the first surface 1102 of the growth substrate 110 to the total number of the carbon nanotubes 170. The takeoff rate of the carbon nanotubes 170 is related to the negative voltage applied to the growth substrate 110. Referring to FIG. 4, when the negative voltage is 0 V, a majority of the carbon nanotubes 170 adhere to the first surface 1102 and grow along the extending direction of the lattices 112, a minority of the carbon nanotubes 170 fly from the first surface 1102 and grow along the direction away from the first surface 1102, and the takeoff rate of the carbon nanotubes 170 is about 14.3%. When the negative voltage is −100 V, most of the carbon nanotubes 170 still adhere to the first surface 1102 and grow along the extending direction of the lattices 112, and the takeoff rate of the carbon nanotubes 170 is about 30.8%. When the negative voltage is −200 V, most of the carbon nanotubes 170 fly from the first surface 1102 and grow along the direction away from the first surface 1102, and the takeoff rate of the carbon nanotubes 170 is about 76.9%. When the negative voltage is −500 V, all of the carbon nanotubes 170 fly from the first surface 1102 and grow along the direction away from the first surface 1102, and the takeoff rate of the carbon nanotubes 170 is about 100%, as shown in FIG. 5. Seen from FIG. 3, after applying the electric field 202 to the growth substrate 110, the length direction of the carbon nanotubes 170 has finally changed to be parallel to the first surface 1102. The plurality of carbon nanotubes 170 continue to grow along a direction parallel to the first surface 1102 after stopping applying the electric field 202 to the growth substrate 110.

Figure 6:
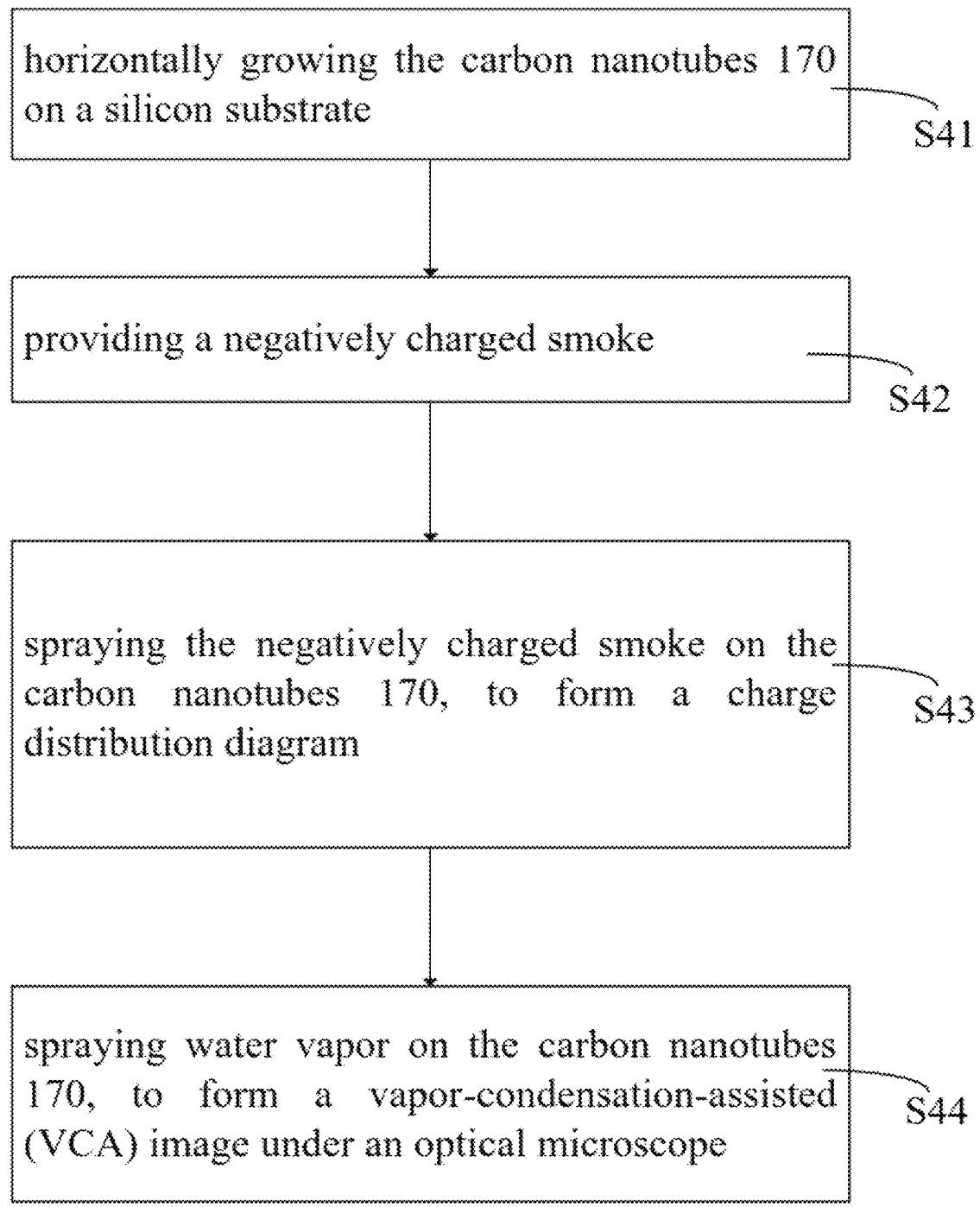
FIG. 6 is a schematic process flow of one embodiment of verifying the carbon nanotubes have negative charges.

An experiment is performed to verify that the carbon nanotube 170 itself is negatively charged. Referring to FIG. 6, the process of the experiment includes steps of:

S41, horizontally growing the carbon nanotubes 170 on a silicon substrate;

S42, providing a negatively charged smoke;

S43, spraying the negatively charged smoke on the carbon nanotubes 170, to form a charge distribution diagram;

S44, spraying water vapor on the carbon nanotubes 170 and the charge distribution diagram, to form a vapor-condensation-assisted (VCA) image under an optical microscope.

In the step S42, the negatively charged smoke includes many hydrophilic nanoparticles and can be a negatively charged NaCl smoke. An atomizer is used to spray a saturated NaCl ethanol solution onto a metal grid. The metal grid is applied the voltage of about −1800 V. The electrons are transferred to tiny droplets in the saturated NaCl ethanol solution. When ethanol is evaporated, the negatively charged NaCl smoke is obtained.

In the step S43, the negatively charged smoke is sprayed onto the carbon nanotubes 170 for about 20 seconds. When the negatively charged smoke is sprayed onto the carbon nanotubes 170, according to the Gauss's law, "like charges repel but opposite charges attract", the negatively charged smoke is repelled from the negative charges of the carbon nanotubes 170. Therefore, the nanoparticles in the negatively charged smoke form the charge distribution diagram.

The charge distribution diagram and the carbon nanotubes 170 are not visible under the optical microscope.

Figure 7:
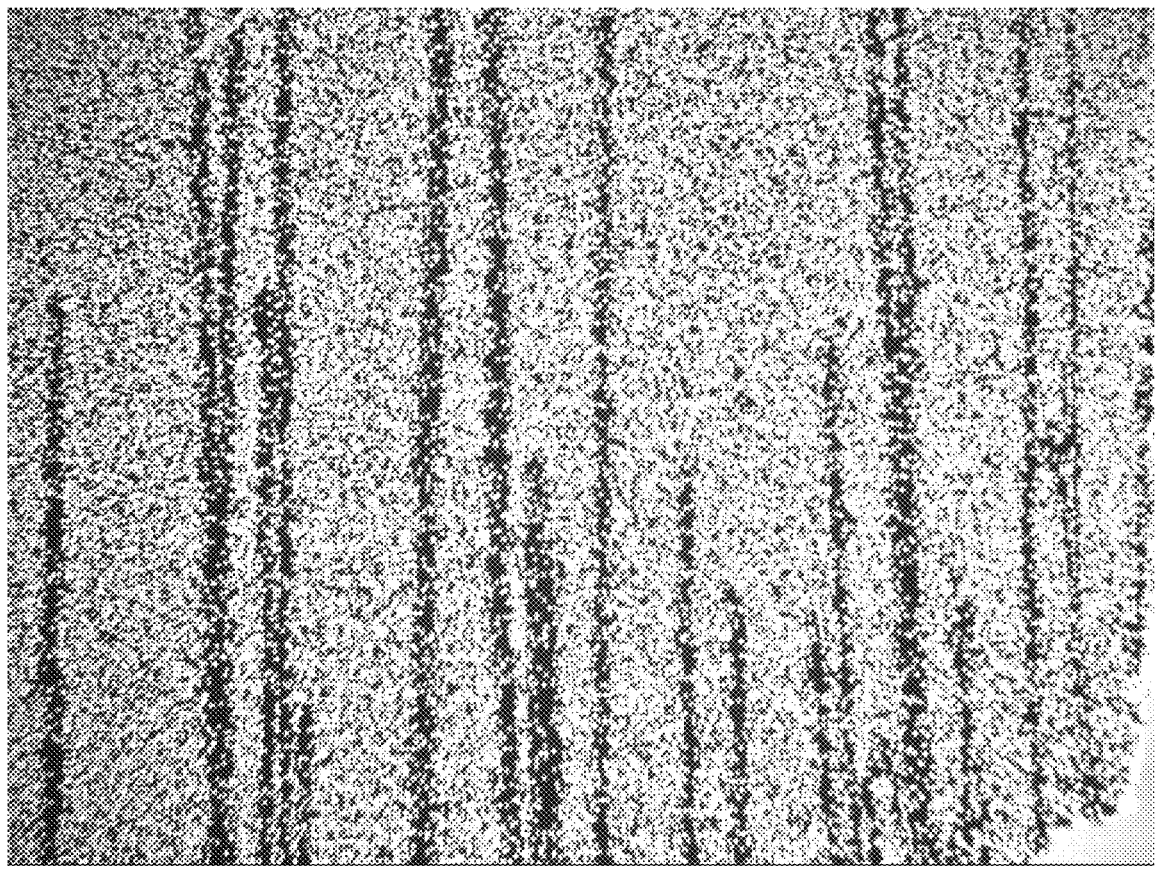
FIG. 7 is a vapor condensation assisted (VCA) image of the carbon nanotubes.

In the step S44, the water vapor is visible under the optical microscope. When the water vapor is sprayed onto the carbon nanotubes 170 and the charge distribution diagram, the nanoparticles of the charge distribution diagram are hydrophilic. Thus the charge distribution diagram is visible under the optical microscope. However, the carbon nanotubes 170 are hydrophobic, thus after spraying water vapor, the carbon nanotubes 170 are still not visible under the optical microscope. In one embodiment, the negatively charged smoke is negatively charged NaCl smoke, and the nanoparticles of the negatively charged smoke are NaCl nanoparticles. Referring to FIG. 7, in the VCA image, the bright region is the region of the presence of the NaCl nanoparticles; because "like charges repel", it is understood that the dark region is the negative charge distribution region. Thus the negative charge distribution region is the carbon nanotubes 170. Whereby the carbon nanotube 170 itself is negatively charged, the negatively charged NaCl smoke is repelled from the carbon nanotubes 170, the carbon nanotube 170 itself is not visible under the optical microscope, and the NaCl nanoparticles sprayed by the water vapor are visible under the optical microscope, so that the dark region is the region where the carbon nanotubes 170 are present. Therefore, the carbon nanotubes are negatively charged.

In the step S5, when the carbon nanotubes 170 fly from the first surface 1102 of the growth substrate 110, the negative voltage is not applied to the growth substrate 110. The carbon nanotubes 170 are not in the electric field 202, wherein the electric field direction of the electric field 202 is from the first surface 1102 to the second surface 1104. The carbon source gas and hydrogen are continually supplied to the reaction chamber 140. In one embodiment, the mixture gas of carbon source gas ($C_2H_2$, 1.0 sccm-1.5 sccm) and hydrogen ($H_2$, 200 sccm) is supplied to the reaction chamber 140 for a time in a range from about 2 minutes to about 10 minutes after stop supplying the electric field 202; and finally the reaction chamber 140 is cooled to room temperature, and the time for cooling to the room temperature is in range from about 6 minutes to about 9 minutes. In one embodiment, the time for cooling to the room temperature is about 8 minute.

The carbon source gas and the hydrogen are stopped supplying. The temperature inside of the reaction chamber 140 is cooled to the room temperature. With the disappearance of the mixture gas formed by the carbon source gas and the hydrogen and the decrease of the temperature inside the reaction chamber 140, the carbon nanotubes 170 stop to grow. A receiving substrate 180 is located inside of the reaction chamber 140 and is near the outlet 16 of the reaction chamber 140. The receiving substrate 180 and the base 120 are spaced from each other. The receiving substrate 180 can have a planar surface. When the filed carbon nanotubes 170 floats above the receiving substrate 180 and the supplying the carbon source gas and hydrogen is stopped, the carbon nanotubes 170 stop growing and fall on the planar surface of the receiving substrate 180 to form the carbon nanotube film 190. The carbon nanotubes 170 of the carbon nanotube film 190 are parallel to the surface of the carbon nanotube film 190 and the top surface of the receiving substrate 180. The carbon nanotubes 170 of the carbon nanotube film 190 extend along the same direction.

The negative voltage is applied to the growth substrate 110 for a period of time from the start of supplying the carbon gas and hydrogen, and the carbon nanotubes 170 are grown in the electric field 202 with the electric field direction of from the first surface 1102 to the second surface 1104. Because the carbon nanotubes 170 are negatively charged, according to the Gauss's law "like charges repel but opposite charges attract", the electric field 202 will change the growth mode of the carbon nanotubes 170. First the growth mode of the carbon nanotubes 170 is attached to the first surface 1102 to horizontally grow along the extending directions of the lattices 112, and then the growth mode of the carbon nanotubes 170 is changed to be flying away from the growth substrate 110 to grow. The first end 172 of the carbon nanotube 170 is connected to the growth substrate 110, and the rest parts of the carbon nanotube 170 is detached from the growth substrate 110 and flies away from the growth substrate 110.

When the carbon nanotubes 170 fly from the first surface 1102 of the growth substrate 110, the negative voltage is not applied to the growth substrate 110, and the carbon nanotubes 170 are not in the electric field 202. The purpose of stopping the application of the electric field 202 to the growth substrate 110 is that making the carbon nanotubes 170 not be in the electric field 202 to avoid the interference of the electric field 202 on the growth of the carbon nanotubes 170.

The electric field 202 is first applied to the carbon nanotubes 170, in order to allow the carbon nanotubes 170 to fly up and grow along the direction away from the first surface 1102 of the growth substrate 110. Then the electric field 202 is removed, in order to prevent the growth of the carbon nanotubes 170 from disturbance of the electric field 202. When the electric field 202 is removed, the carbon nanotubes 170 still do not fall onto the growth substrate 110. The reason is that the carbon source gas and the hydrogen allow the carbon nanotubes 170 not to fall onto the growth substrate 110. The carbon nanotubes 170 still fly and grow along the air flow direction of the mixture gas formed by the carbon source gas and the hydrogen. The carbon nanotubes 170 can have a longer length, because there is no disturbance of the electric field 202 in the subsequent growth process. The length of the carbon nanotubes 170 of the carbon nanotube film 190 can reach centimeters level.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

Additionally, it is also to be understood that the above description and the claims drawn to a method may include some indication in reference to certain steps. However, the indication used is only to be viewed for identification purposes and not as a suggestion as to an order for the steps.

What is claimed is:

1. A method for making carbon nanotube film, the method comprising:

providing a growth substrate having a first surface and a second surface opposite to the first surface;

depositing a catalyst layer on the first surface;

placing the growth substrate and the catalyst layer in a reaction chamber;

supplying a carbon source gas and hydrogen into the reaction chamber and simultaneously applying an electric field to the growth substrate, wherein the reaction chamber is heated to be a growth temperature to grow a plurality of carbon nanotubes, and an electric field direction of the electric field is from the first surface to the second surface;

after a portion of each of the plurality of carbon nanotubes flies away from the growth substrate, stopping applying the electric field to the growth substrate, continually supplying the carbon source gas and hydrogen into the reaction chamber, and controlling a growth direction of the plurality of carbon nanotubes to be only substantially parallel to the first surface after the electric fields is stopped; and stopping supplying the carbon source gas and hydrogen into the reaction chamber, and allowing the portion of each of the plurality of carbon nanotubes to fall to a receiving substrate.

2. The method of claim 1, wherein the growth substrate is insulated at the growth temperature.

3. The method of claim 1, wherein the growth substrate is a single crystal quartz.

4. The method of claim 1, further comprising annealing the growth substrate for a time from about 7 hours to about 9 hours in an oxygen atmosphere at a temperature from about 700 degrees Celsius to about 1000 degrees Celsius.

5. The method of claim 1, wherein the growth substrate is located on a surface of a base.

6. The method of claim 5, wherein the base is conductive at the growth temperature.

7. The method of claim 5, wherein a material of the base is monocrystalline silicon.

8. The method of claim 5, further comprising providing a metal shell surrounding the reaction chamber, a negative voltage is applied between the base and the metal shell to form the electric field, and the negative voltage is in a range from about −1000 volts to about 0 volts.

9. The method of claim 8, wherein the negative voltage is in a range form −500 volts to about 0 volts.

10. The method of claim 8, wherein a time of applying the negative voltage is in a range from about 1 second to about 10 seconds.

11. The method of claim 1, wherein the applying the electric field to the growth substrate comprising:

providing a conductive base;

placing a conductive plate in the reaction chamber, wherein the conductive plate is opposite to and spaced from the conductive base, and the growth substrate is located between the conductive base and the conductive plate; and forming the electric field between the conductive plate and the conductive base, wherein the electric field direction is from the conductive plate to the conductive base.

12. The method of claim 11, wherein a distance between the conductive plate and the growth substrate is in a range from about 4 centimeters to about 5 centimeters.

13. The method of claim 11, wherein a material of the conductive plate is graphite or silicon.

14. The method of claim 1, wherein the applying the electric field to the growth substrate comprising:

providing a metal shell surrounding the reaction chamber;

locating a conductive base in the reaction chamber, wherein the growth substrate is located on the conductive base; and placing a power supply outside of the reaction chamber, wherein the conductive base is electrically connected to the metal shell by the power supply.

15. The method of claim 1, the receiving substrate is inside of the reaction chamber to allow the carbon nanotube film fall on the receiving substrate.

16. A method for making carbon nanotube film, the method comprising:

providing a growth substrate having a first surface and a second surface opposite to the first surface;

depositing a catalyst layer on the first surface;

placing the growth substrate and the catalyst layer in a reaction chamber;

applying an electric field to the growth substrate, wherein an electric field direction of the electric field is from the first surface to the second surface;

after applying the electric field to the growth substrate, supplying a carbon source gas and hydrogen into the reaction chamber at a growth temperature to grow a plurality of carbon nanotubes; and after a portion of each of the plurality of carbon nanotubes flies away from the growth substrate, stopping applying the electric field to the growth substrate, and continually supplying the carbon source gas and hydrogen into the reaction chamber, wherein the plurality of carbon nanotubes continue to only grow along a direction parallel to the first surface after stopping applying the electric field.

17. A method for making a plurality of carbon nanotubes, the method comprising:

providing a growth substrate having a first surface and a second surface opposite to the first surface;

depositing a catalyst layer on the first surface;

placing the growth substrate and the catalyst layer in a reaction chamber;

supplying a carbon source gas and hydrogen into the reaction chamber to grow a plurality of carbon nanotubes and simultaneously applying an electric field to the growth substrate, wherein an electric field direction of the electric field is from the first surface to the second surface; and after a portion of each of the plurality of carbon nanotubes flies away from the growth substrate, stopping applying the electric field to the growth substrate, and continually supplying the carbon source gas and hydrogen into the reaction chamber, wherein the plurality of carbon nanotubes continue to grow along a direction substantially parallel to the first surface after stopping applying the electric field, so that lengths of the plurality of carbon nanotubes extend along the direction substantially parallel to the first surface of the growth substrate; and after stopping applying the electric field to the growth substrate and continually supplying the carbon source gas and hydrogen into the reaction chamber, the lengths of all of the plurality of carbon nanotubes extend along the direction substantially parallel to the first surface of the growth substrate.

18. The method of claim 17, wherein a time of applying the electric field to the growth substrate is in a range from about 1 second to about 10 seconds.

* * * * *